(12) United States Patent
Lee et al.

(10) Patent No.: US 11,416,052 B2
(45) Date of Patent: Aug. 16, 2022

(54) POWER SUPPLY APPARATUS

(71) Applicants: INVENTEC (PUDONG) TECHNOLOGY CORPORATION, Shanghai (CN); INVENTEC CORPORATION, Taipei (TW)

(72) Inventors: Shao Hung Lee, Taipei (TW); Hui-Ming Tsai, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 292 days.

(21) Appl. No.: 16/716,191

(22) Filed: Dec. 16, 2019

(65) Prior Publication Data
US 2021/0157379 A1 May 27, 2021

(30) Foreign Application Priority Data
Nov. 22, 2019 (CN) .......................... 201911155972.7

(51) Int. Cl.
| | |
|---|---|
| *G06F 1/26* | (2006.01) |
| *H05K 1/14* | (2006.01) |
| *H05K 1/18* | (2006.01) |
| *H02B 1/20* | (2006.01) |

(52) U.S. Cl.
CPC ............... *G06F 1/266* (2013.01); *H02B 1/20* (2013.01); *H05K 1/14* (2013.01); *H05K 1/181* (2013.01)

(58) Field of Classification Search
CPC ........................................................ G06F 1/266
USPC ...................................................... 174/133 B
See application file for complete search history.

(56) References Cited

U.S. PATENT DOCUMENTS

| | | | |
|---|---|---|---|
| 9,201,482 B2 * | 12/2015 | Lin .......................... | G06F 1/305 |
| 2015/0280480 A1 * | 10/2015 | Mitri ..................... | H02J 7/0013 |
| | | | 307/22 |

* cited by examiner

*Primary Examiner* — Stanley Tso
(74) *Attorney, Agent, or Firm* — Maschoff Brennan

(57) ABSTRACT

A power supply apparatus is electrically connected with a load and one of a second substrate, a third substrate and a fourth substrate each of which has a first locking portion. The power supply apparatus comprises a first substrate, a power distribution circuit and a position board. The first substrate comprises a first coupling portion and a second coupling portion. The power distribution circuit is disposed at the first substrate, receives the external electric power and converts it into a supplying power. The position board comprises a second locking portion that is coupled to the second coupling portion of the first substrate when the power supply apparatus is electrically connected with one of the second substrate and the third substrate. The first locking portion of one of the second substrate, the third substrate and the fourth substrate is coupled to the first coupling portion of the first substrate.

14 Claims, 7 Drawing Sheets

US 11,416,052 B2

POWER SUPPLY APPARATUS

CROSS-REFERENCE TO RELATED APPLICATIONS

This non-provisional application claims priority under 35 U.S.C. § 119(a) on Patent Application No(s). 201911155972.7 filed in China on Nov. 22, 2019, the entire contents of which are hereby incorporated by reference.

BACKGROUND

1. Technical Field

This disclosure relates to a power supply apparatus, and particularly to a combined power supply apparatus.

2. Related Art

Nowadays, a common redundant power supply (CRPS) on the market has a specific structure and circuit design according to the structural specification and electrical demand of the applied server. Therefore, when the specification of a server is changed or the electricity demand of the server is changed since the circuit design of the server is modified, the power supply apparatus originally applied to the server cannot be applied to the changed server, and the whole power supply apparatus has to be redesigned, resulting in extremely high development costs. In addition, due to the complexity of the circuit of the whole power supply apparatus, the redesign of the circuit is quite difficult.

Furthermore, in the related fields, various manufacturers have different preferences for the case of the power supply apparatus. Therefore, in the customized manufacturing process, the structural arrangement of the components on the first substrate of the power supply apparatus usually needs to be redesigned so as to apply to different sizes of cases, which also results in considerable manufacturing costs.

SUMMARY

According to an embodiment of this disclosure, a power supply apparatus is electrically connected with a load and one of a second substrate, a third substrate and a fourth substrate. The power supply apparatus receives external electric power. Each of the second substrate, the third substrate and the fourth substrate has a first locking portion. The power supply apparatus comprises a first substrate, a power distribution circuit and a position board. The first substrate comprises a first coupling portion and a second coupling portion. The power distribution circuit is disposed at the first substrate, receives the external electric power and converts the external electric power into a supplying power. The position board comprises a second locking portion, with the second locking portion of the position board coupled to the second coupling portion of the first substrate when the power supply apparatus is electrically connected with one of the second substrate and the third substrate. The first locking portion of one of the second substrate, the third substrate and the fourth substrate is coupled to the first coupling portion of the first substrate.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
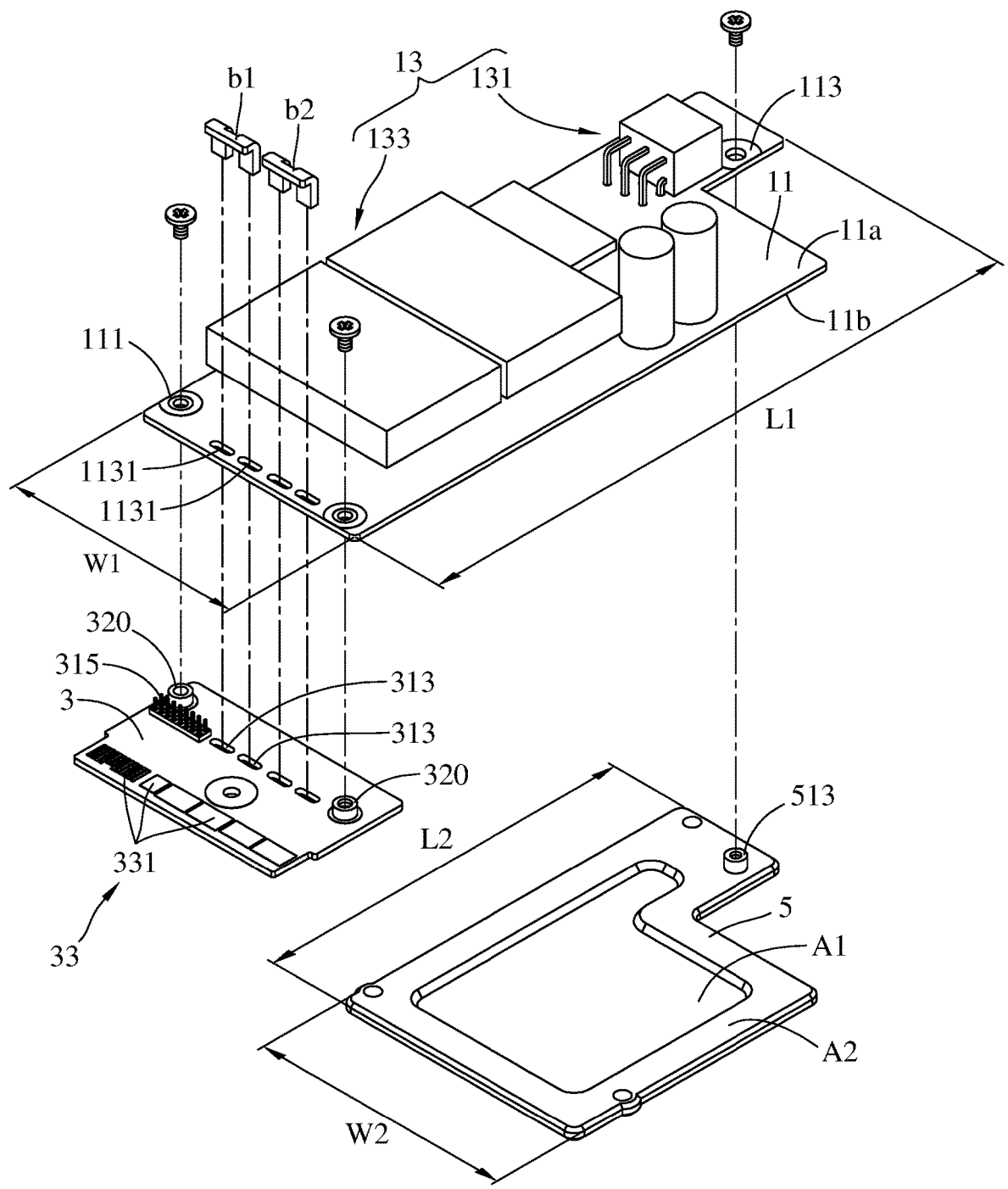
FIG. 1 is a schematic structural diagram of a power supply apparatus according to an embodiment of this disclosure.
Figure 2:
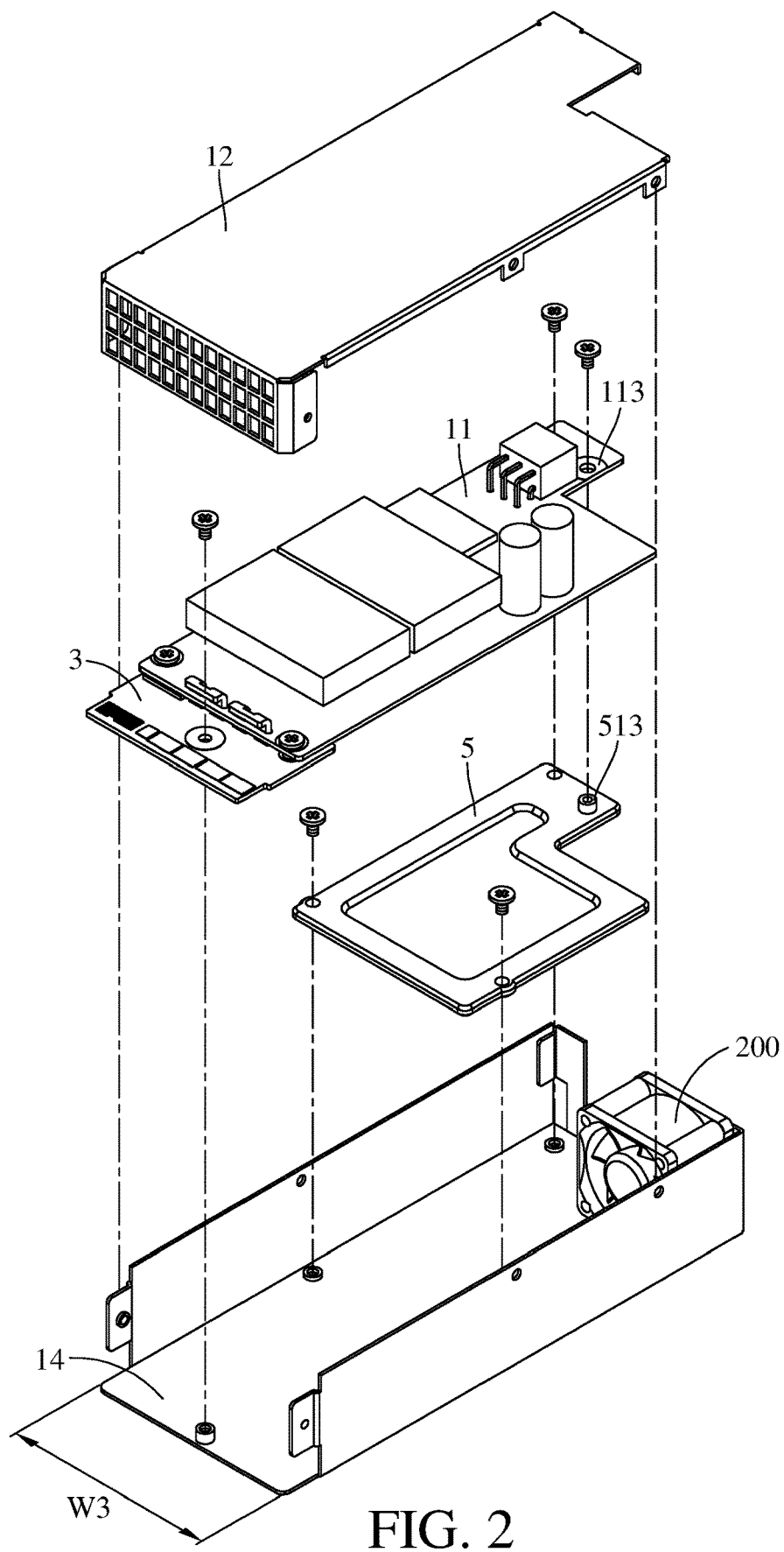
FIG. 2 is an installation diagram of a power supply apparatus according to an embodiment of this disclosure.

This disclosure provides a power supply apparatus applied to a load, wherein the load can be a server, an industrial computer or other electronic device. Please refer to FIG. 1 and FIG. 2, wherein FIG. 1 is a schematic structural diagram of a power supply apparatus according to an embodiment of this disclosure, and FIG. 2 is an installation diagram of a power supply apparatus according to an embodiment of this disclosure. As shown in FIG. 1 and FIG. 2, a power supply apparatus 10 can comprise a first substrate 11 and a position board 5, and be installed in a case. More particularly, the case can comprise an upper casing 12 and a lower casing 14. The power supply apparatus 10 is fixed in the lower casing 14, and the detailed coupling method will be described later.

A power distribution circuit 13 is disposed on the first substrate 11. The first substrate 11 is, for example, a FR-4 glass fiber substrate, a FR-4 epoxy substrate, a metal core board (MCPCB) or a substrate made of other material. The first substrate 11 has a first surface 11a and a second surface 11b which are opposite to each other. The first substrate 11 comprises a first coupling portion 111 and a second coupling portion 113, wherein the first coupling portion 111 is coupled to a first locking portion 320 of the second substrate 3, and the second coupling portion 113 is coupled to a second locking portion 513 of the position board 5. For example, the first coupling portion 111 is implemented by one or more through holes in the first substrate 11, the first locking portion 320 is implemented by one or more standoffs, the second coupling portion 113 is implemented by one or more through holes in the first substrate 11, and the second locking portion 513 is implemented by one or more standoffs.

In a preferred embodiment of this disclosure, the first coupling portion 111 and the first locking portion 320 of the second substrate 3 are coupled together by being locked by one or more screws, and the second coupling portion 113 and the second locking portion 513 of the position board 5 are coupled together by being locked by one or more screws.

Please refer to FIG. 1, the second substrate 3 is coupled to the second surface 11b of the first substrate 11, and the lower surface of the second substrate 3 is approximately 4 millimeters (mm) from the lower surface of the lower casing 14.

In the embodiment shown in FIGS. 1 and 2, the first substrate 11 is designed to have a notch for installing a fan 200. However, the first substrate 11 can also be a rectangle without a notch. The shape of the first substrate of this disclosure is not limited to the above.

The power distribution circuit 13 is disposed at the first substrate 11, and is configured to convert external electric power into supplying power. For example, the power distribution circuit 13 can comprise at least an input circuit 131 and a main power module group 133 for receiving 48-volt power (DC voltage) from the outside and converting it into 12-volt power (DC voltage). The detailed circuit structure of the power distribution circuit 13 will be described later. It should be noted that FIGS. 1 and 2 merely exemplarily illustrate the power distribution circuit 13, but are not used to limit the three-dimensional structure of the power distribution circuit 13. Although the power distribution circuit 13 shown in FIG. 1 is disposed on the first surface 11a of the first substrate 11, a part of the power distribution circuit 13 can be disposed on the second surface 11b actually.

The second substrate 3 of the power supply apparatus 10 is coupled to the first substrate 11 and configured to connect to the load. The second substrate 3 comprises an output circuit 33. For example, the second substrate 3 is a FR-4 substrate, a metal core board (MCPCB) or a substrate made of other material. In the embodiment shown in FIGS. 1 and 2, the first substrate 11 can have a number of coupling holes 1131, and the second substrate 3 can also have a number of coupling holes 313. The first substrate 11 and the second substrate 3 can be coupled together through busbars b1 and b2 and the coupling holes 1131 and 313. In this embodiment, each of the busbars b1 and b2 corresponds to two coupling holes 1131 of the first substrate 11 and corresponds to two coupling holes 313 of the second substrate 3. In other embodiments, a single busbar can correspond to one or more than two coupling holes, and the first substrate 11 and the second substrate 3 can be coupled together through one or more than two busbars.

More particularly, by using screw(s) and busbar(s) for coupling as described above, the first substrate 11 can be detachably coupled to the second substrate 3. Moreover, the second substrate 3 can be coupled to the first substrate 11 in other detachable ways, and this disclosure does not intend to limit it. As shown in FIG. 2, in addition to being coupled to the first substrate 11, the second substrate 3 can also be locked to the lower casing 14 by screws for example, and the first substrate 11 can also be coupled to the lower casing 14 by screws. However, the screws in FIG. 2 are exemplary, and this disclosure does not intend to limit the method for coupling the second substrate 3 and the case.

The output circuit 33 is disposed at the second substrate 3, and electrically connected with the power distribution circuit 13 of the first substrate 11 to output the supplying power generated by the power distribution circuit 13 to the load. In the embodiment shown in FIGS. 1 and 2, the power distribution circuit 13 and the output circuit 33 can be electrically connected with each other via the aforementioned busbars b1 and b2. More particularly, the busbars b1 and b2 are made of a conductive material such as metal. The power distribution circuit 13 can be electrically connected with the busbars b1 and b2 via the part (not shown) of the power distribution circuit that is disposed on the first surface 11a, the second surface 11b or the interlayer of the first substrate 11, and the power distribution circuit 13 can be electrically connected with the output circuit 33 of the second substrate 3 via the busbars b1 and b2. Moreover, the power distribution circuit 13 and the output circuit 33 can also be electrically connected with each other via the socket (not shown) disposed on the first substrate 11 and the pins 315 disposed on the second substrate 3. In this embodiment, the electrical connection between the power distribution circuit 13 and the output circuit 33 can be detachable. In addition to being electrically connected with the power distribution circuit 13, the output circuit 33 can comprise an output port 331 to be electrically connected with the load, wherein the specification of the output port corresponds to the specification of the power input port of the load. For example, the output port 331 can be implemented by gold finger(s).

With the above-mentioned detachable mechanical coupling method and detachable electrical connection method, the second substrate 3 of the power supply apparatus 10 can be replaced according to the specification of the load. Therefore, the power supply apparatus 10 can be connected with various loads by replacing the second substrate 3. In other embodiments, the second substrate 3 can be fixedly coupled to the first substrate 11 by adhesion or other means, and the electrical connection between the power distribution circuit 13 and the output circuit 33 can be inseparable (for example, by soldering). In multiple embodiments of this disclosure, a single type of first substrate can be coupled to one of various external boards (e.g. the aforementioned second substrate 3). Therefore, in the design process of various power supply apparatuses with different load specifications, the situation of redesigning the entire structure/circuit of each power supply apparatus due to the different load specification may be avoided, and thereby the development costs of the power supply apparatuses may be reduced.

The position board 5 of the power supply apparatus 10 is coupled to the second coupling portion 113 of the first substrate 11, and configured to stably couple the first substrate 11 to the case. More specifically, the position board 5 can be disposed between the first substrate 11 and the lower casing 14, wherein the first surface 11a of the first substrate 11 faces away the position board 5, and the second surface 11b of the first substrate 11 faces the position board 5. In the embodiment shown in FIGS. 1 and 2, the position board 5, similar to the first substrate 11, is designed to have a notch for installing a fan 200; however, the position board 5 can also be a rectangle without a notch. The shape of the position board of this disclosure is not limited to the above.

In multiple embodiments of this disclosure, the length of the position board 5 is designed to be shorter than the length of the first substrate 11, and the width of the position board 5 is designed to be wider than or equal to the width of the first substrate 11. In other words, if the first substrate 11 has a first length L1 and a first width W1 and the position board 5 has a second length L2 and a second width W2, the second length L2 is smaller than the first length L1 and the second width W2 is larger than or equal to the first width W1. In this way, the position board 5 may stably couple the first substrate 11 to the case without hindering the coupling of the first coupling portion 111 and the second substrate 3. More particularly, the second width W2 of the position board 5 can correspond to the width W3 of the case.

The position board 5 can be made of the same material as the first substrate 11 or the second substrate 3, or can be made of a metal material. In the embodiment shown in FIG. 1, the position board 5 has a recessed region A1 and a peripheral area A2, wherein the distance between the recessed region A1 and the first substrate 11 is larger than the distance between the peripheral area A2 and the first substrate 11. In particular, the recessed region A1 can correspond to the setting region of the power distribution circuit 13 on the second surface 11b of the first substrate 11 so that the position board 5 may less affect the operation of the power distribution circuit 13. More particularly, the recessed region A1 can be filled with non-conductive gel, so that the coupling of the position board 5 and the first substrate 11 may be improved, and the first substrate 11 may be more stably coupled to the lower casing 14 without affecting the operation of the power distribution circuit 13.

In this embodiment, the position board 5 can be locked to the second coupling portion 113 of the first substrate 11 by one or more screws. More particularly, since the position board 5 is coupled to the first substrate 11 by screw(s), the position board 5 can be detached from the first substrate 11; that is, the position board 5 is detachably coupled to the first substrate 11. Moreover, the position board 5 can be coupled to the first substrate 11 in other detachable ways, and this disclosure does not intend to limit it. With the detachable coupling method, the position board 5 of the power supply apparatus 10 can be replaced according to the size of the lower casing 14. The power supply apparatus 10 can replace the position board 5 for applying to cases in various sizes. In another embodiment, the position board 5 can be fixedly coupled to the first substrate 11 by adhesion or other mean. In multiple embodiments of this disclosure, a single type of first substrate 11 can be coupled to one of various sizes of position boards 5 or have no need for the position board 5 to match the size of the case. Therefore, in the design process of various power supply apparatuses respectively disposed in cases in different sizes, the situation of redesigning the entire structure/circuit of each power supply apparatus due to the different sizes of the cases may be avoided, and thereby the development costs of the power supply apparatuses may be reduced.

Figure 3:
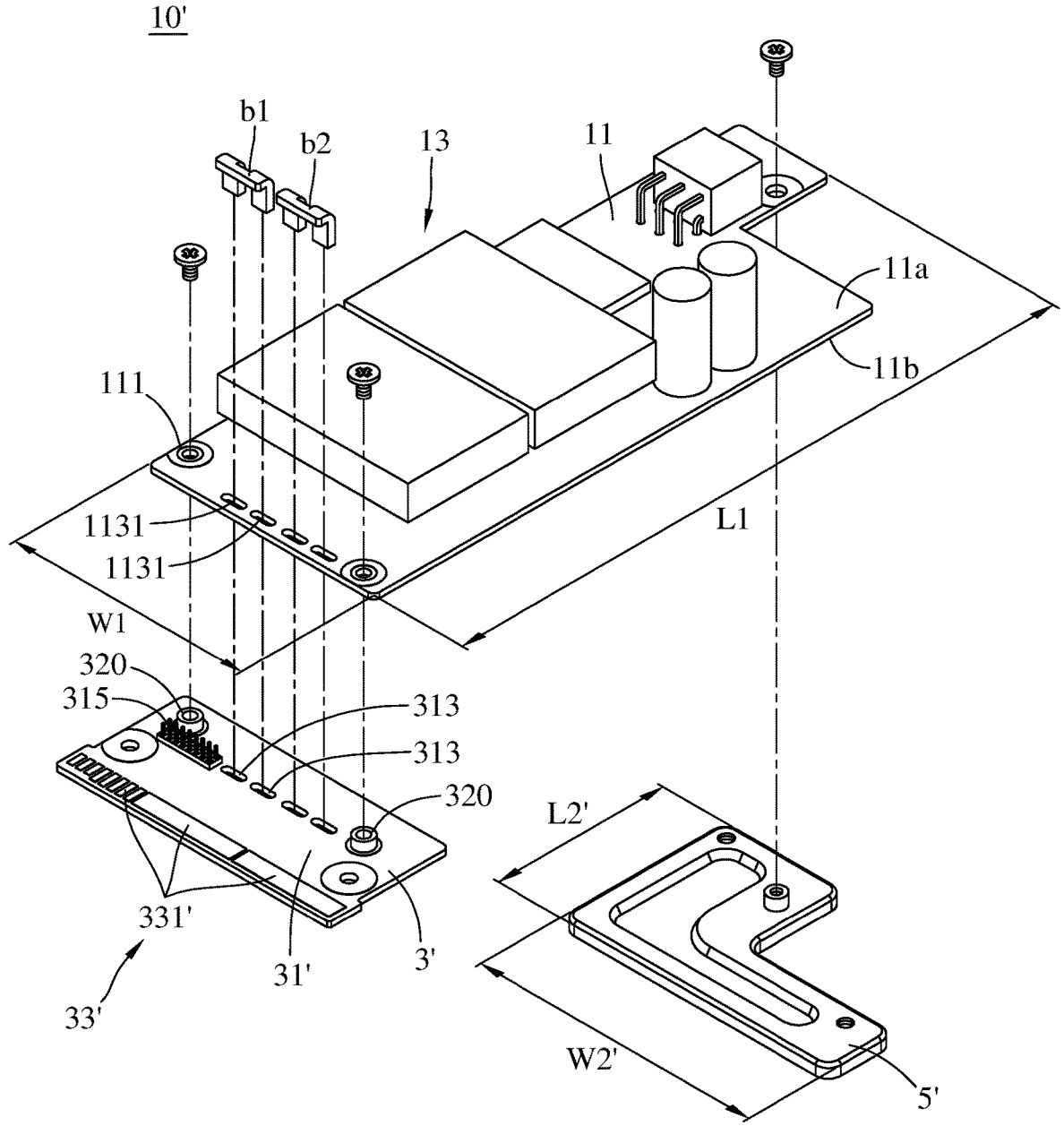
FIG. 3 is a schematic structural diagram of a power supply apparatus according to another embodiment of this disclosure.

Please refer to FIGS. 1 and 3, wherein FIG. 3 is a schematic structural diagram of a power supply apparatus according to another embodiment of this disclosure. As aforementioned, a single type of first substrate 11 can be coupled to one of various external boards for respectively matching the specifications of various loads, or/and coupled to one of various position boards for respectively matching the sizes of various cases. In comparison with the power supply apparatus 10 in FIG. 1, the power supply apparatus 10' shown in FIG. 3 has approximately the same first substrate 11 but a different external board (third substrate 3') and a different position board 5'. As shown in FIG. 3, the first substrate 11 has the power distribution circuit 13, wherein the details about the first substrate 11 and the power distribution circuit 13 are identical or similar to those of the aforementioned embodiments, and are not repeated here.

The third substrate 3' has a different size, a different shape and a different output circuit 33' from the second substrate 3, and particularly has an output port 331' with a different specification. In other words, the power supply apparatus 10' and the power supply apparatus 10 are respectively applicable to loads with different specifications. The coupling method of the third substrate 3' and the first substrate 11 is similar to that of the second substrate 3 and the first substrate 11. In terms of structural coupling, the third substrate 3' and the first substrate 11 can be coupled together by screw(s) or other detachable or inseparable methods, and can be coupled together by the busbars b1 and b2, the coupling holes 1131 of the first substrate 11 and the coupling holes 313 of the third substrate 3'; in terms of electrical connection, the output circuit 33' and the power distribution circuit 13 can be electrically connected with each other via the above mentioned busbars b1 and b2, and can also be electrically connected with each other via socket(s) (not shown) and pins 315, wherein the related details are substantially the same as those of the aforementioned embodiments and are not repeated here.

Please refer to FIG. 3, the third substrate 3' is coupled to the second surface 11b of the first substrate 11, and the lower surface of the third substrate 3' is approximately 4 mm from the lower surface of the lower casing 14.

In comparison with the position board 5, the position board 5' has the wider second width W2' but the shorter second length L2'. More particularly, the collocation of the wider second width W2' and the shorter second length L2' can have a stability equivalent to that of the collocation of the second width W2 and the second length L2. In other words, in design, the second width and the second length can have a negative correlation. In this way, in the design of the position board, the material cost may be simplified, and the ability to stabilize the first substrate in the case of the position board may be taken into account. Moreover, in comparison with the power supply apparatus 10 equipped with the position board 5, the power supply apparatus 10' equipped with the position board 5' is suitable for the case with the larger width.

Figure 4:
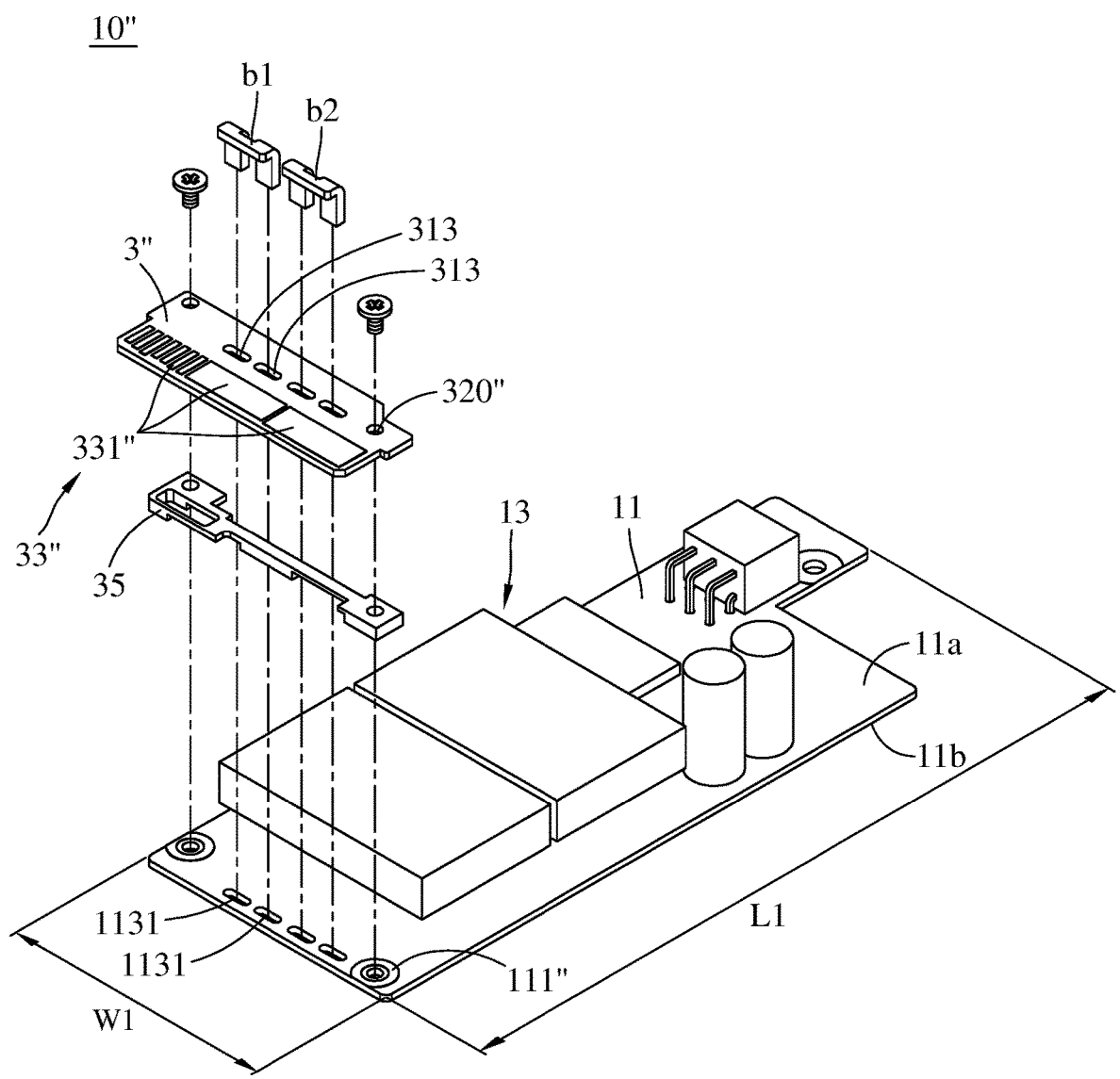
FIG. 4 is a schematic structural diagram of a power supply apparatus according to yet another embodiment of this disclosure.

In the aforementioned embodiments, the external board (second substrate 3/third substrate 3') is coupled to the second coupling portion 113 in the direction of the second surface 11b towards the first surface 11a of the first substrate 11. However, in other embodiments, the external board can be coupled to the second coupling portion 113 in the direction of the first surface 11a towards the second surface 11b of the first substrate 11. Please refer to FIGS. 1 and 4, wherein FIG. 4 is a schematic structural diagram of a power supply apparatus according to yet another embodiment of this disclosure. In comparison with the power supply apparatus 10 in FIG. 1, the power supply apparatus 10" shown in FIG. 4 has approximately the same first substrate 11 but a different external board (fourth substrate 3"). As shown in FIG. 4, the first substrate 11 has the power distribution circuit 13, wherein the details about the first substrate 11 and the power distribution circuit 13 are identical or similar to those of the aforementioned embodiments, and are not repeated here.

The fourth substrate 3" has a different size, a different shape and a different output circuit 33" from the second substrate 3, and particularly has an output port 331" with a different specification. In other words, the power supply apparatus 10" and the power supply apparatus 10 are respectively applicable to loads with different specifications. For example, the first coupling portion 111" is implemented by one or more through holes in the first substrate 11, and the first locking portion 320" is implemented by one or more through holes in the fourth substrate 3".

In a preferred embodiment of this disclosure, the first coupling portion 111" and the first locking portion 320" of the fourth substrate 3" are coupled together by being locked by one or more screws.

Please refer to FIG. 4, the fourth substrate 3" is coupled to the first surface 11a of the first substrate 11, and the lower surface of the fourth substrate 3" is approximately 8.5 mm from the lower surface of the lower casing 14.

In terms of structural coupling, the fourth substrate 3" and the first substrate 11 can be coupled together by screw(s) or other detachable or inseparable methods, and can be coupled together by the busbars b1 and b2, the coupling holes 1131 of the first substrate 11 and the coupling holes 313 of the fourth substrate 3". More particularly, a supporting component 35 can be added between the fourth substrate 3" and the first substrate 11, so as to increase the distance between the fourth substrate 3" and the bottom of the case. In particular, the supporting component 35 is an optional component, and can also be added to the embodiment where the fourth substrate 3" is coupled to the first substrate 11 in the direction of the first surface 11a towards the second surface 11b, so as to adjust the distance between the fourth substrate 3" and the bottom of the case to match the height of the input port of the load. In terms of electrical connection, the output circuit 33" and the power distribution circuit 13 can be electrically connected with each other via the busbars b1 and b2, and can also be electrically connected with each other via socket(s) (not shown) and pins. The first substrate 11 is disposed under the supporting component 35, and the fourth substrate 3" is disposed above the supporting component 35.

In the following, several embodiments will be provided to illustrate the circuit structure that the power supply apparatus 10, 10' or 10" of the above embodiments can include, especially the structure of the power distribution circuit 13 of the first substrate 11. However, this disclosure does not intend to limit that the circuit structure of the power supply apparatus 10, 10' or 10" merely have the following implementations.

Figure 5:
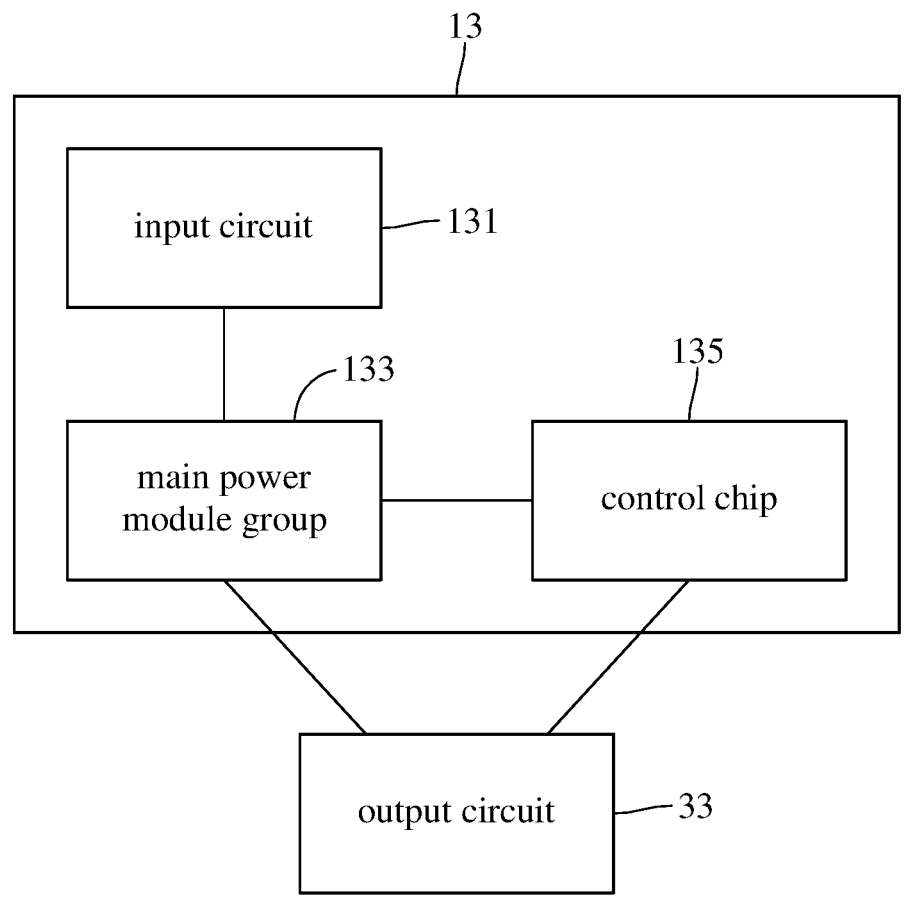
FIG. 5 is a functional block diagram of a circuit structure of a power supply apparatus according to an embodiment of this disclosure.

Please refer to FIGS. 1 and 5, wherein FIG. 5 is a functional block diagram of a circuit structure of a power supply apparatus according to an embodiment of this disclosure. The power distribution circuit 13 at the first substrate 11 of the power supply apparatus 10 is electrically connected with the output circuit 33 of the second substrate 3. As shown in FIG. 5, the power distribution circuit 13 comprises an input circuit 131, a main power module group 133 and a control chip 135. The input circuit 131 is configured to receive an external electric power, such as the 48-volt power as aforementioned. The main power module group 133 is electrically connected with the input circuit 131, the control chip 135 and the output circuit 33, and controlled by the control chip 135. The main power module group 133 is configured to convert the external electric power into the supplying power, such as the 12-volt power as aforementioned, and to transmit the supplying power to the output circuit 33 according to a control instruction generated by the control chip 135. The control chip 135 is also electrically connected with the output circuit 33, and configured to generate the control instruction described above according to the electricity demand of the load.

Figure 6:
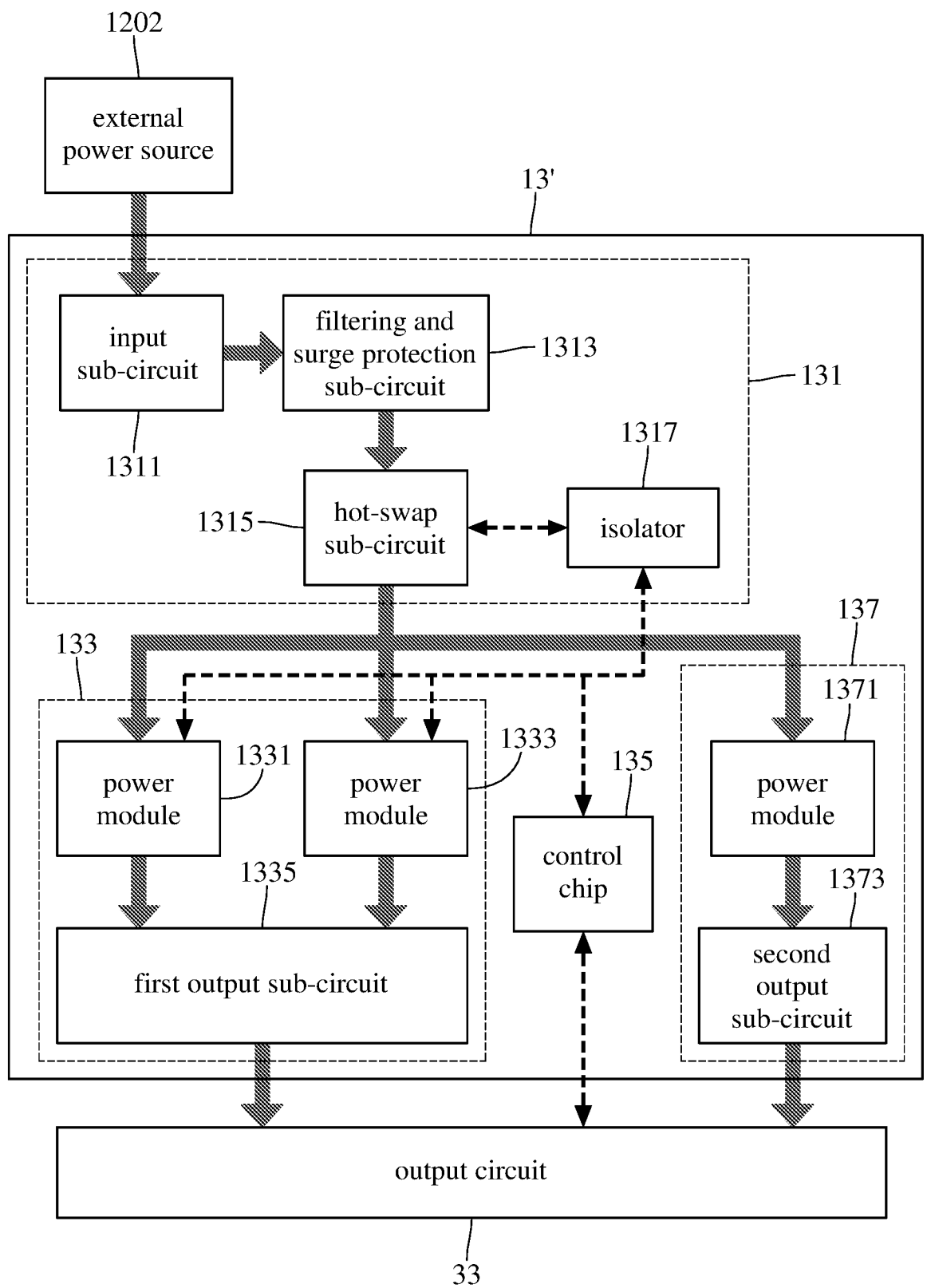
FIG. 6 is a functional block diagram of a circuit structure of a power supply apparatus according to an embodiment of this disclosure.

Please refer to FIGS. 5 and 6 for further explaining the circuit structure of a power supply apparatus, wherein FIG. 6 is a functional block diagram of a circuit structure of a power supply apparatus according to an embodiment of this disclosure. In FIG. 6, the solid lines represent the paths of power transmission, and the dotted lines represent the paths of signal transmission. In addition to the input circuit 131, the main power module group 133 and the control chip 135 included in the power distribution circuit 13 as shown in FIG. 5, the power distribution circuit 13' in FIG. 6 further comprise a backup power module group 137.

The input circuit 131 can comprise an input sub-circuit 1311, a filtering and surge protection sub-circuit 1313, a hot-swap sub-circuit 1315 and an isolator 1317. The input sub-circuit 1311 is, for example, an input connector, and is configured to be electrically connected with an external power source 1202 to obtain the external electric power. The filtering and surge protection sub-circuit 1313 comprises an electromagnetic interference (EMI) filter and a surge protection circuit, and has the functions of suppressing electromagnetic interference and suppressing surges. The detailed electronic components of the filtering and surge protection sub-circuit 1313 can be understood by a person having ordinary skill in the art, so they are not described in detail here. The hot-swap sub-circuit 1315 and the isolator 1317 are controlled by the control chip 135, and thereby the power supply apparatus is hot-swappable to the external power source 1202. For example, the hot-swap sub-circuit 1315 includes a hot-swap controller, an induction resistor and a transistor (e.g. metal-oxide-semiconductor field-effect transistor, MOSFET), and the hot-swap sub-circuit 1315 is connected with the isolator 1317 via a power management bus (PMBus) or an integrated circuit bus (I2C Bus). The hot-swap controller can read the voltage/current information of the induction resistor to control the operation of the switch of the transistor, and therefore the protection mechanism for the front-end input power source may be achieved.

The main power module group 133 and the backup power module group 137 can each have one or more power modules. The difference between the main power module group 133 and the backup power module group 137 is that the power module(s) in the main power module group 133 is controlled by the control chip 135 but the power module(s) in the backup power module group 137 is controlled by the internal control chip of the backup power module group 137. In other words, the main power module group 133 and the backup power module group 137 can be both enabled, for example. During normal operation, the main power module group 133 is electrically connected with the load, but the backup power module group 137 is not electrically connected with the load. When the load (e.g. server) detects that the main power module group 133 fails to provide power correctly, the load is disconnected from the main power module group 133 and the load is connected to the backup power module group 137.

More particularly, in the implementation of a power module group multiple power modules, the power supply efficiency of each power module in the same power module group is preferably the same.

In the embodiment shown in FIG. 6, the main power module group 133 comprises two power modules 1331 and 1333 and a first output sub-circuit 1335, and the backup power module group 137 comprises one power module 1371 and a second output sub-circuit 1373. The number of modules shown in FIG. 6 is merely an example but is not limited to this. The power modules 1331, 1333 and 1371 are electrically connected with the hot-swap sub-circuit 1315 to receive the external electric power that is processed (e.g. filtered). The power modules 1331, 1333 and 1371 each comprise a voltage converter to convert the external electric power into the supplying power with a specific voltage. The purpose of installing the main power module group 133 and the backup power module group 137 is that although a single power module can supply the electricity demand of the server, when the main power module group 133 is damaged, the backup power module group 137 is used to supply the power. Both the main power module group 133 and the backup power module group 137 can be controlled by the control chip 135.

The power modules 1331 and 1333 of the main power module group 133 is controlled by the control chip 135 to selectively transmit the supplying power through the first output sub-circuit 1335 to the output circuit 33 of the second substrate 3 according to a control instruction generated by the control chip 135. The power module 1371 of the backup power module group 137 is controlled by the internal control chip of the backup power module group 137, and can transmit the supplying power directly through the second output sub-circuit 1373 to the output circuit 33. For example, the first output sub-circuit 1335 and the second output sub-circuit 1373 are implemented in the form of socket(s) or pins electrically connected to the output circuit 33 as aforementioned.

The control chip 135 can be connected with the power modules 1331 and 1333 of the main power module group 133 and the output circuit 33 of the second substrate 3 via a power management bus (PMBus) or an integrated circuit bus (I2C Bus), for example. The control chip 135 is, for example, a programmable system-on-chip (PSoC), and can obtain the electricity demand of the load through the output circuit 33 to generate a control instruction for controlling the main power module group 133. In a case, it is assumed that the power modules 1331 and 1333 can each output N watts of power. In this case, when the control chip 135 detects that the required power (electricity demand) of the load is greater than N watts by the output circuit 33, the control chip 135 generates a control instruction that enables both the power modules 1331 and 1333; when the required power of the load is equal to or less than N watts, the control chip 135 generates a control instruction that instructs one of the power modules 1331 and 1333 to be enabled and the other one to be disabled.

Moreover, the control chip 135 can also obtain an electricity value (e.g. voltage value, current value, power value) of each the power modules 1331 and 1333 to judge whether any of the power modules 1331 and 1333 is abnormal, and send out a warning signal through the output circuit when judging that any of the power modules 1331 and 1333 is abnormal. The control chip 135 can transmit the obtained electricity value to the load for the load to judge whether the electricity value is abnormal. In this embodiment, the control chip 135 can also be electrically connected with the isolator 1317 of the input circuit 131 to obtain the operational state of the isolator 1317 and to obtain the operational state of the hot-swap sub-circuit 1315 through the isolator 1317. Similar to the above-mentioned judgement on the electricity value, the control chip 135 can judge whether the hot-swap function is abnormal according to the obtained operational state, or transmit the operational state to the load for the load to perform the judgement.

Figure 7:
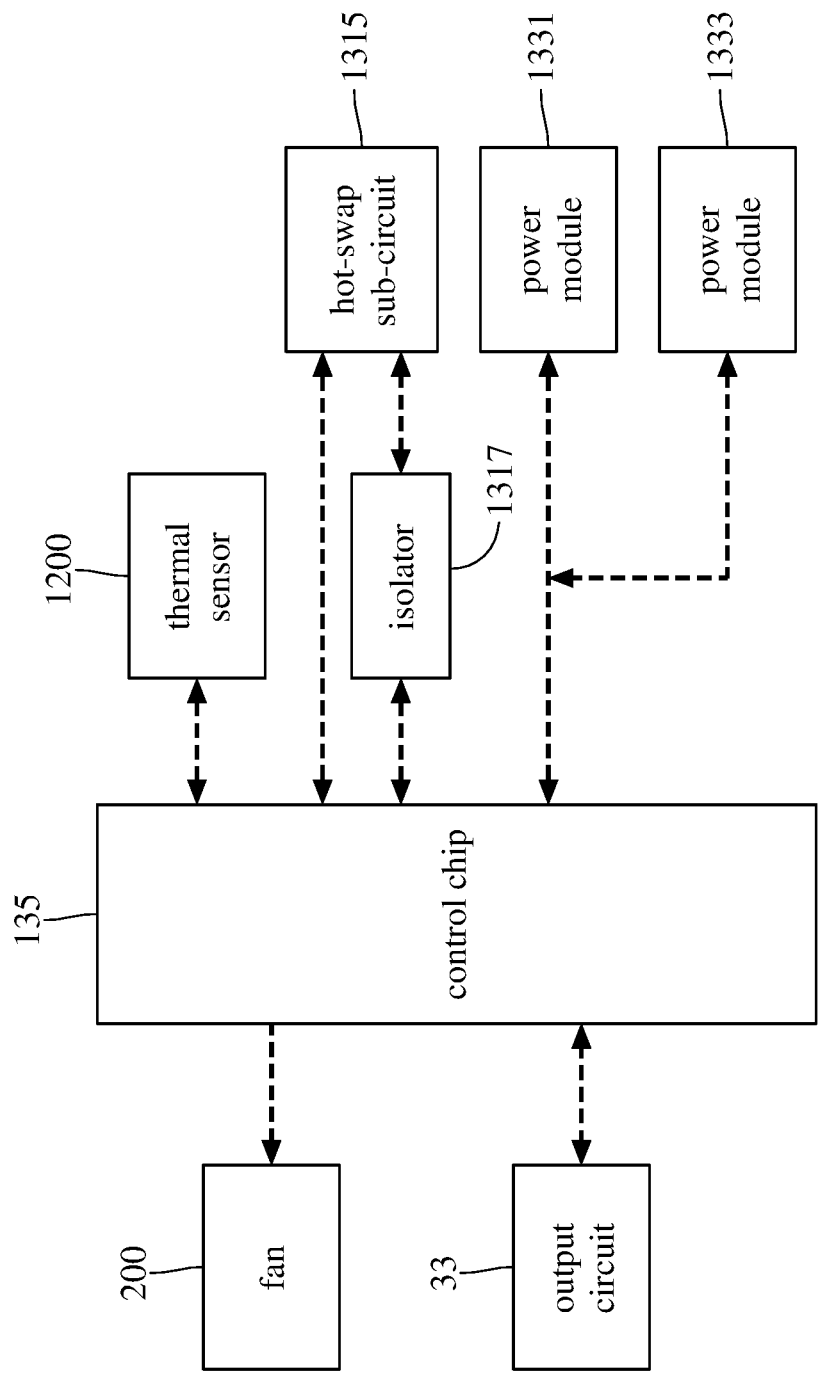
FIG. 7 is a communication block diagram of a control chip of a power supply apparatus according to another embodiment of this disclosure.

In another embodiment, in addition to controlling the main power module group 133 and obtaining the operational states of main power module group 133 and the isolator 1317, the control chip 135 can further be electrically connected with other components disposed in the case. Please refer to FIG. 7 which is a communication block diagram of the control chip 135 according to another embodiment of this disclosure. As shown in FIG. 7, in addition to being electrically connected with the power modules 1331 and 1333, the isolator 1317 and the output circuit 33 for transmitting signals to each other as described in the preceding embodiments, the control chip 135 can further be electrically connected with a thermal sensor 1200 and a fan 200. The thermal sensor 1200 and the fan 200 are both disposed in the case. The thermal sensor 1200 can disposed on the first substrate 11 described in the preceding embodiments to serve as one component of the power distribution circuit 13 or 13'; or, the thermal sensor 1200 can be disposed in other regions in the case, which is not limited in this disclosure. The control chip 135 can obtain the internal ambient temperature of the case from the thermal sensor 1200, and thereby control the rotation speed of the fan 200. Moreover, in this embodiment, the control chip 135 can be connected with the hot-swap sub-circuit 1315 through the isolator 1317 or directly to obtain its operational state.

In addition to applying to the power supply apparatus 10 of FIG. 1, the circuit structures of the power distribution circuits 13 and 13' shown in FIGS. 5 and 6 can also apply to the power supply apparatus 10' in FIG. 3 and the power supply apparatus 10" in FIG. 4. More specifically, the power distribution circuit 13 or 13' can be disposed at the first substrate 11 of the power supply apparatus 10' in FIG. 3, and in this case, the power distribution circuit 13 or 13' is electrically connected with the output circuit 33' of the third substrate 3'; in another case, the power distribution circuit 13 or 13' is disposed at the first substrate 11 of the power supply apparatus 10" in FIG. 4, and the power distribution circuit 13 or 13' is electrically connected with the output circuit 33" of the fourth substrate 3".

In view of the above description, the power supply apparatus of this disclosure has a number of implementations where a single type of first substrate can be coupled to one of various external boards for respectively matching the specifications of various loads, or/and coupled to one of various position boards or have no position board for respectively matching the sizes of various cases. Therefore, in the design process of various power supply apparatuses with various load specifications or/and various case sizes, it may not be necessary to redesign the entire structure/circuit of each power supply apparatus, and merely external boards or/and position boards have to be designed; thereby, the development costs of the power supply apparatuses may be reduced. Moreover, with the detachable coupling method, the power supply apparatus can be connected with various loads by replacing the external board, and apply to cases in various sizes by replacing the position board. In addition, the power supply apparatus provided in this disclosure performs DC power conversion by one or more modularized power modules, so it may provide different power supply modes according to the electricity demand of the load. In this way, the power supply apparatus of this disclosure may have no need to change the design of the power conversion circuit when the electricity demand of the load changes, and may have simpler circuit design than the conventional power supply, and therefore have the lower manufacturing costs.

What is claimed is:

1. A power supply apparatus, electrically connected with a load and one of a second substrate, a third substrate and a fourth substrate, with each of the second substrate, the third substrate and the fourth substrate having an output circuit and a first locking portion, and the power supply apparatus comprising:
   a first substrate comprising a first coupling portion and a second coupling portion;
   a power distribution circuit disposed at the first substrate, wherein the power distribution circuit comprises:
      a control chip electrically connected with the load, and configured to generate a control instruction according to an electricity demand of the load;
      an input circuit receiving an external electric power;
      a main power module group electrically connected with the control chip, the input circuit and the output circuit; and a backup power module group electrically connected with the input circuit and the output circuit;

wherein the main power module group comprises a plurality of power modules and a first output sub-circuit, the backup power module group comprises at least one power module and a second output sub-circuit, and the power modules are electrically connected with the input circuit to receive the external electric power and convert the external electric power into a supplying power;

wherein each of the plurality of power modules of the main power module group is controlled by the control chip to selectively transmit the supplying power through the first output sub-circuit to the output circuit according to the control instruction, the at least one power module of the backup power module group is controlled by an internal control chip of the backup power module group, and transmit the supplying power directly through the second output sub-circuit to the output circuit; and a position board comprising a second locking portion, with the second locking portion of the position board coupled to the second coupling portion of the first substrate when the power supply apparatus is electrically connected with one of the second substrate and the third substrate;

wherein the first locking portion of one of the second substrate, the third substrate and the fourth substrate is coupled to the first coupling portion of the first substrate.

2. The power supply apparatus according to claim 1, wherein the output circuit comprises an output port with a specification corresponding to a specification of the load.

3. The power supply apparatus according to claim 1, wherein the first substrate comprises a first surface and a second surface, wherein the second substrate is coupled to the second surface of the first substrate.

4. The power supply apparatus according to claim 1, wherein the first substrate comprises a first surface and a second surface, wherein the third substrate is coupled to the second surface of the first substrate.

5. The power supply apparatus according to claim 1, wherein the first substrate comprises a first surface and a second surface, the fourth substrate is coupled to the first surface of the first substrate, and a supporting component is disposed between the fourth substrate and the first surface of the first substrate.

6. The power supply apparatus according to claim 1, wherein the position board has a recessed region and a peripheral area, a distance between the recessed region and the first substrate is larger than a distance between the peripheral area and the first substrate.

7. The power supply apparatus according to claim 6, wherein the first substrate comprises a first surface and a second surface, the first surface faces away from the position board, the second surface faces toward the position board, and the recessed region corresponds to a setting region of the power distribution circuit on the second surface.

8. The power supply apparatus according to claim 1, wherein one or both of the position board and one of the second substrate, the third substrate and the fourth substrate are detachably coupled to the first substrate.

9. The power supply apparatus according to claim 1, wherein the input circuit comprise an input sub-circuit, a filtering and surge protection sub-circuit, a hot-swap sub-circuit and an isolator.

10. The power supply apparatus according to claim 9, wherein the filtering and surge protection sub-circuit comprises an electromagnetic interference (EMI) filter and a surge protection circuit, and has functions of suppressing electromagnetic interference and suppressing surges.

11. The power supply apparatus according to claim 9, wherein the hot-swap sub-circuit is connected with the isolator via a power management bus (PMBus) or an integrated circuit bus (I2C Bus), the hot-swap sub-circuit and the isolator are controlled by the control chip so that the power supply apparatus is hot-swappable to the external electric power.

12. The power supply apparatus according to claim 11, wherein the hot-swap sub-circuit includes a hot-swap controller, an induction resistor and a transistor, and the hot-swap controller reads voltage/current information of the induction resistor to control an operation of a switch of the transistor.

13. The power supply apparatus according to claim 1, wherein the main power module group and the backup power module group are enabled, during a normal operation, the main power module group is electrically connected with the load, the backup power module group is not electrically connected with the load, and when the load detects that the main power module group fails to provide the supplying power correctly, the load is disconnected from the main power module group and the load is connected to the backup power module group.

14. The power supply apparatus according to claim 1, wherein the control chip electrically connected with a thermal sensor and a fan, the control chip obtains an internal ambient temperature from the thermal sensor, and controls a rotation speed of the fan.

\* \* \* \* \*